United States Patent
Jeong

(10) Patent No.: US 7,100,066 B2
(45) Date of Patent: Aug. 29, 2006

(54) CLOCK DISTRIBUTION DEVICE AND METHOD IN COMPACT PCI BASED MULTI-PROCESSING SYSTEM

(75) Inventor: Sang Ik Jeong, Suwon-shi (KR)

(73) Assignee: LG Electronics Inc., Seoul (KR)

( * ) Notice: Subject to any disclaimer, the term of this patent is extended or adjusted under 35 U.S.C. 154(b) by 550 days.

(21) Appl. No.: 10/329,695

(22) Filed: Dec. 27, 2002

(65) Prior Publication Data

US 2003/0122601 A1    Jul. 3, 2003

(30) Foreign Application Priority Data

Dec. 28, 2001    (KR) .............................. 2001-86993

(51) Int. Cl.
*G06F 1/10*    (2006.01)
*G06F 1/04*    (2006.01)

(52) U.S. Cl. .................. 713/500; 713/501; 713/503; 713/600; 327/152; 327/158; 327/271; 327/393; 710/313; 710/314; 710/315; 710/316; 386/3; 386/18; 386/89; 709/248; 709/249; 709/250; 709/253

(58) Field of Classification Search ................ 713/500, 713/501, 503, 600; 710/313–316; 327/149, 327/152, 158, 271, 393, 395; 386/3, 18, 386/89, 299, 302, 304; 709/248, 249, 253
See application file for complete search history.

(56) References Cited

U.S. PATENT DOCUMENTS 4,375,639 A * 3/1983 Johnson, Jr. ............. 340/825.5
4,977,582 A * 12/1990 Nichols et al. ............. 375/371
5,220,660 A * 6/1993 Yoshizawa et al. ......... 713/375
5,414,381 A * 5/1995 Nelson et al. ............... 327/262
5,848,065 A * 12/1998 Gorshe et al. .............. 370/376
5,864,564 A * 1/1999 Levitt et al. ................ 714/731
6,292,903 B1 * 9/2001 Coteus et al. ............... 713/401
6,343,007 B1 * 1/2002 Dubois et al. .............. 361/683
6,351,827 B1 * 2/2002 Co et al. ....................... 714/42
6,425,027 B1 * 7/2002 Mills et al. ................. 710/300
6,501,660 B1 * 12/2002 Ho et al. ..................... 361/752
6,643,791 B1 * 11/2003 Teodorescu ................. 713/500
6,654,898 B1 * 11/2003 Bailey et al. ............... 713/500
6,763,016 B1 * 7/2004 Teodorescu ................. 370/350
6,847,652 B1 * 1/2005 Fourcand et al. ........... 370/438
2003/0065861 A1* 4/2003 Clark et al. ................. 710/305
2003/0074637 A1* 4/2003 Pavesi et al. ................... 716/1

\* cited by examiner

*Primary Examiner*—Lynne H. Browne
*Assistant Examiner*—Nitin C. Patel
(74) *Attorney, Agent, or Firm*—Fleshner & Kim, LLP

(57) ABSTRACT

Disclosed is a clock distribution device and method in a compact PCI system based multi-processing system. A compact PCI based multi-processing system preferably includes processing signals upon mounting various circuit boards on multiple slots, even if the location of the system slot is varied, the skew of clocks transmitted to the other slots may be minimized. Accordingly, the system may be configured in a flexible manner because of such variability of the system slot's location. Further, the system may be efficiently repaired and maintained because it is possible to easily and quickly take measures in response to any failure occurring on the board mounted on the system slot.

16 Claims, 5 Drawing Sheets

CLOCK DISTRIBUTION DEVICE AND METHOD IN COMPACT PCI BASED MULTI-PROCESSING SYSTEM

BACKGROUND OF THE INVENTION

1. Field of the Invention

The present invention relates to clock distribution in a compact peripheral component interconnect (PCI) system, and more particularly to a method and clock distribution device in a compact PCI based multi-processing system.

2. Background of the Related Art

Generally, a compact PCI based multi-processing system connects various circuit boards to its multiple slots to process multiple signals. In this structure, the system board connected to the system slot distributes the clock to the other boards so that such other boards may operate in synchronization with the supplied clock.

In a general compact PCI system, eight slots constitute a system. Among the eight slots, only one slot may function as the system slot to which the system board may be connected and the other slots function as peripheral slots to which various I/O boards may be connected.

FIG. 1 illustrates a compact PCI system of the related art. The system slot SL1, to which the system board is connected, supplies a clock to each of the peripheral slots SL2~SL8. Thus, the system slot SL1 may supply a total of seven clocks.

Specifically, CLK0 outputted from slot 1 SL1 is connected to the clock input terminal CLK0 of slot 2 SL2. Likewise, CLK1 from SL1 is connected to the clock input terminal CLK0 of slot 3 SL3, CLK2 from SL1 to CLK0 of CL4, CLK3 from SL1 to CLK0 of SL5, CLK4 from SL1 to CLK0 of SL6, CLK5 from SL1 to CLK0 of SL7, and CLK 6 from SL1 to CLK0 of SL8. Each board connected to each slot of the peripheral slots SL2~SL8 uses the clock supplied by SL1 internally in each board to conduct its relevant operation in synchronization with the supplied clock.

In order for the compact PCI system of the related art to efficiently operate, the clocks supplied from the system slot SL1 should not have a skew over a certain error range. Thus, to limit the error range of the skew, the compact PCI specification of the related art limits the number of slots in accordance with the used clock rate (e.g., eight slots are used for 33 MHZ clock and five slots are used for 66 MHZ clock). Furthermore, the distance between two neighboring slots is limited to be within a certain range (e.g., the distance is made not to exceed 20.32 mm).

By limiting the number of slots and the distance between slots according to the relevant clock rate, the routing length on the back-plane is maintained to be between 135 mm and 185 mm. Accordingly, the maximum skew of the clock on the back-plane does not exceed certain time. For example, if the clock is 33 MHZ, the maximum skew is 1.2 ns and if the clock is 66 MHz, the maximum skew is 0.2 ns.

In order to route the clocks CLK0~CLK6 in compliance with the requirements of a general PCI specification, the related art general compact PCI system delays, which occur in transmitting the clocks to respective slots SL2~SL8 from the system slot SL1, should have the same value. Accordingly, as illustrated in FIG. 1, the closer a slot is located to the system slot SL1, the greater delay is required through the relevant delay line. For example, the delay line of additional "6d" is used for slot 2 SL2 and the delay line of additional "5d" is used for slot 3 SL3. Likewise, the delay line of additional "4d" is used for slot 4 SL4, "3d" for slot 5 SL5, "2d" for slot 6 SL6, and "d" for slot 7 SL7.

Accordingly, in order to prevent the maximum skew of the clocks transmitted by the system board to the other boards from exceeding a certain limit time, the compact system of the related art delay lines are previously installed in clock transmission paths of the system. Thus, the system board may not be connected to any other board than the system slot SL1. Accordingly, flexible structuring of the system is impossible.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a clock distribution device in a compact PCI based multi-processing system and method where the system board may be connected in a flexible manner.

It is another object of the present invention to provide a clock distribution device is a compact PCI based multi-processing system and method, where even if the location of a slot for the system board changes in a compact PCI system where various circuit boards are installed on multiple slots for signal processing, the skew of the clock transmitted to each slot may be minimized.

In order to achieve at least the above objects in whole or in parts, there is provided a clock distribution device in a compact PCI based multi-processing system including a clock transmission device implemented on the back-plane for transmitting clocks between multiple slots, through which clocks outputted from a slot located at a higher rank may be transmitted to other lower-rank slots; and a clock driver for, if its board is mounted on a slot among the multiple slots, checking whether the slot on which its board has been mounted is the system slot and, if the slot is the system slot, supplying its generated clocks to the other slots and outputting its generated clock for its internal use or, if the slot is a peripheral slot, blocking its generated clocks and outputting the clock supplied from the system slot as the clock to be used internally.

Preferably, the routing lengths on the back-plane of the clocks supplied from the system slot to the other slots by the clock driver are fixed in correspondence to the delay occurring at the time of clock transmission.

In order to further achieve at least the above objects, in whole or in parts, there is provided a clock driver, including a clock generator which generates a clock; a clock distributor which distributes the clock supplied from the clock generator into multiple clocks and outputs them; multiple variable delay lines which delay and transmit multiple clocks supplied from the clock distributor through delay lines of which the delay length may vary; multiple buffers which switch outputs of the clocks supplied through the variable delay lines to the other slots; a buffer which buffs and outputs the clock supplied from a variable delay line specified among the multiple variable delay lines as the delay line for the internal use of the clock; a multiplexer which selects one between the clock supplied from the buffer and a clock supplied from another external slot and outputs the selected clock as the clock to be used internally within its board; and a clock driver configuration logic which checks whether its board is mounted on the system board based upon the address signal and the slot enumeration signal of any higher-rank slot and controls operations of the variable delay lines, the buffers and the multiplexer.

In order to further achieve at least the above objects, in whole or in parts, there is provided a clock distribution method, including configuring, at the board mounted on the system slot, the delay lines corresponding to the location of the system slot; transmitting the clocks generated at the board mounted on the system slot to the peripheral slots through the delay lines; receiving, at the boards mounted on the peripheral slots, the clocks transmitted from the system slot; and selecting and using, at the boards mounted on the peripheral slots, the clocks received from the system slot as their respective internal clocks.

In a preferred embodiment of the present invention, no system board is mounted on any higher-rank slot of the system slot. When the board mounted on the system slot transmits the clocks generated thereon to the peripheral slots through the delay lines, the delay line specified for the clock that is to be used within the board itself has the delay that is equal to the total delay occurring through the other delay lines. In the present invention, the clocks supplied from the system slot reach the peripheral slots with the same delay regardless of each the location of the system slot.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made to preferred embodiments of the present invention as illustrated in the accompanying drawings.

In a compact PCI system which processes signals by having various circuit boards in multiple slots and in which the location of relevant slots may vary, the skew in the clock transmitted to each slot may be minimized according to a preferred embodiment of the present invention.

For example, in a compact PCI based multi-processing system according to the preferred embodiment of the present invention, a system consists of eight slots. Each slot may be connected to a system board or an I/O board. The system may include multiple system boards having the same feature and I/O boards that the system boards may share. System boards are mounted from the side of slot 1 and I/O boards are mounted from the side of slot 8. The respective numbers of system boards and I/O boards may vary depending on the system configuration.

Preferably, if there are multiple system boards, it needs to be determined which slot will function as the system slot. For this purpose, a preferred embodiment of the present invention adopts the "Ripple" method. Specifically, if a system board is mounted on slot 1, then slot 1 becomes the system slot. If a system board is mounted on slot 2 but no board is mounted on slot 1, then slot 2 becomes the system slot. Thus, for a slot (subject slot) to become the system slot, all the slots located before the subject slot (higher-rank slots) must have no boards on them. In this manner, depending on the system configuration, the location of the system slot is determined.

Figure 1:
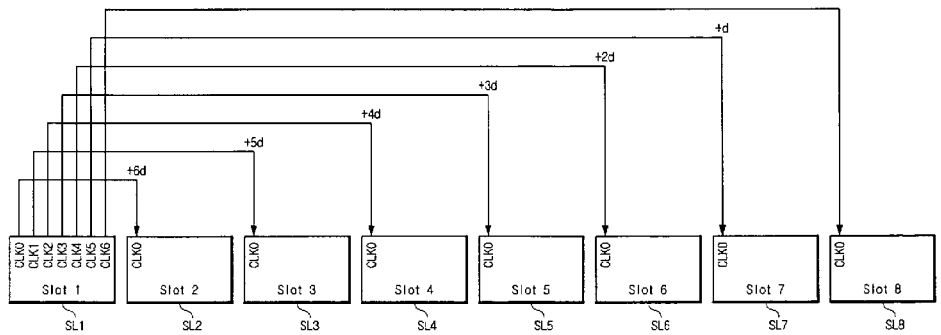
FIG. 1 illustrates a clock distribution method used in a general compact PCI system in the related art.
Figure 2:
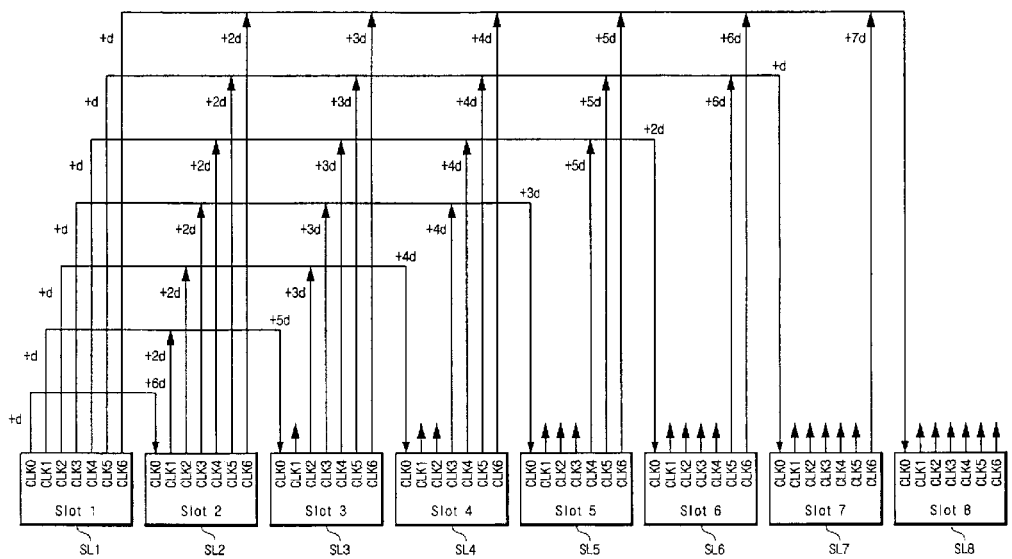
FIG. 2 illustrates a clock distribution method in a compact PCI based multiprocessing system according to a preferred embodiment of the present invention.

Accordingly, the board mounted on the system board determined according to the preferred embodiment of supplies clocks to the other boards. As illustrated in FIG. 2, slot 1 SL1 supplies clocks to all the other slots SL2~SL8 and slot 2 SL2 supplies clocks to all the other slots SL3~SL8 except for slot 1 SL1. In the same manner, slot 3 SL3 supplies clocks to all the other slots SL4~SL8 except for slot 1 SL1 and slot 2 SL2, slot 4 SL4 supplies clocks to all the other slots SL5~SL8 except for slots 1 to 3 SL1~SL3, slot 5 SL5 supplies clocks to all the other slots SL6~SL8 except for slots 1 to 4 SL1~SL4, slot 6 SL6 supplies clocks to all the other slots SL7~SL8 except for slots 1 to 5 SL1~SL5, and slot 7 supplies clock to slot 8 SL8.

For the proper operation of a compact PCI based multiprocessing system illustrated in FIG. 2, the skew of clocks supplied by the system slot to the other slots located after the determined system slot (subordinate slots) needs to be within a certain prescribed range. In order to limit the skew, the routing length through which clocks are transmitted from the system slot to its subordinate slots is fixed to a length that corresponds to the delay "$8d$" occurring at the clock transmission. This structure is implemented on the back-plane and the system board.

Figure 3:
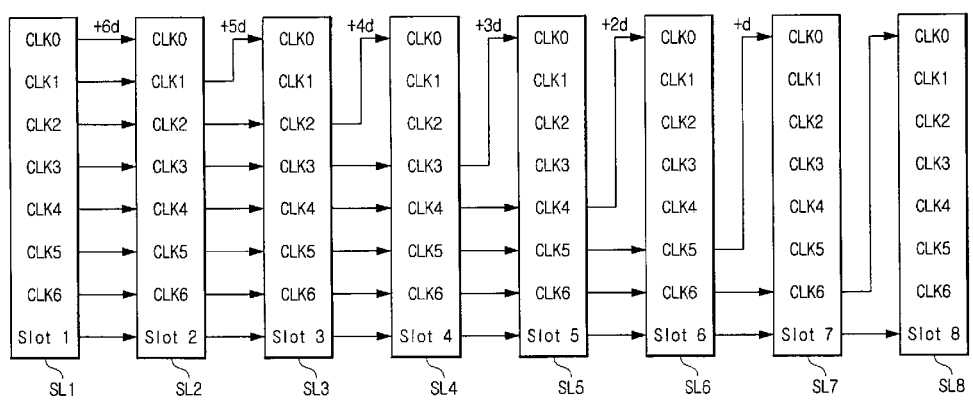
FIG. 3 illustrates the clock distribution method on a back-plane according to the preferred embodiment of the present invention.

Additional information regarding the routing to distribute clocks on the back-plane according to a preferred embodiment of the present invention is next provided. As shown in FIG. 3, for the routing from CLK0 of slot 1 SL1 to the clock terminal CLK0 of slot 2 SL2, a delay line of "$6d$" is required. Additionally, for the routing from CLK1 of slot 1 SL1 to the clock terminal CLK of slot 3 SL3, the delay line of "$5d$" is required. Further, for the routing from CLK 2 of SL1 to CLK0 of SL4, the delay line of "$4d$" is required, for the routing from CLK 3 of SL1 to CLK 0 of SL5, the delay line of "$3d$" is required, for the routing from CLK 4 of SL1 to CLK0 of SL6, the delay line of "$2d$" is required, and for the routing from CLK 5 of SL1 to CLK0 of SL 7, the delay line of "d" is required. The routing lines other than those described above have the basic routing delay "d".

Additionally, in order to transmit clocks from the system slot to the other slots with the fixed delay of "$8d$", delay lines are implemented at each system board, in addition to the delay lines on the back-plane. In the preferred embodiment of the present invention, the total delay in clock transmission caused by the delay lines at the system board and on the back-plane is maintained to be "$8d$."

Figure 4:
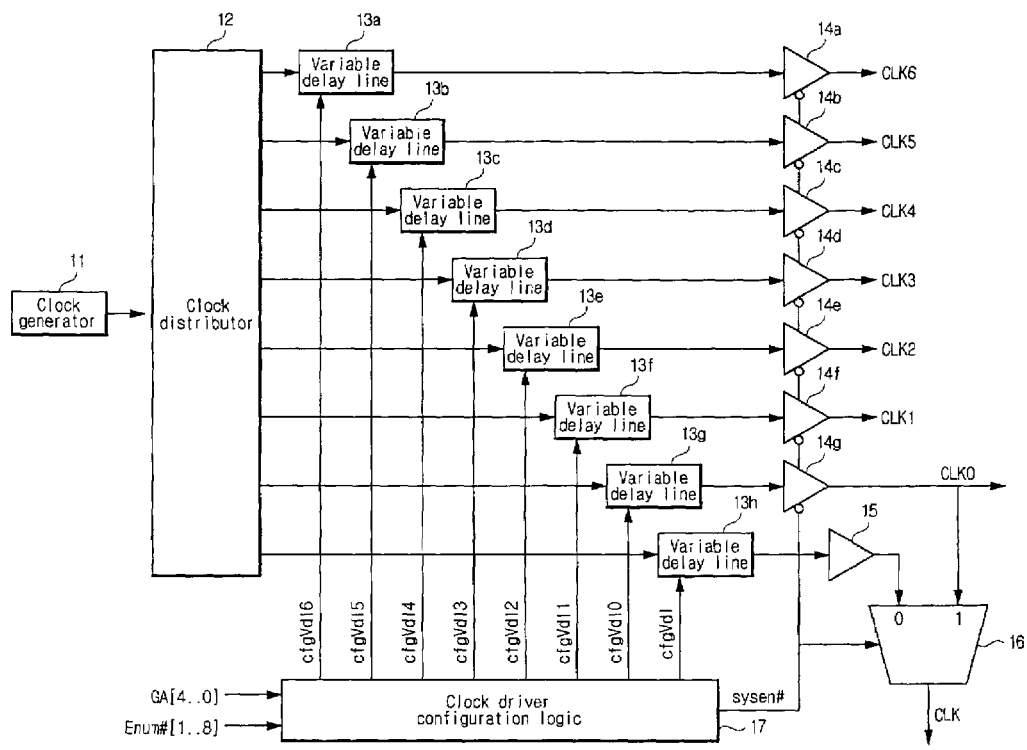
FIG. 4 illustrates the structure of a clock driver according to the preferred embodiment of the present invention.

Additional information regarding a clock driver built on a system board is next provided. As shown in FIG. 4, the clock driver preferably includes a clock generator 11, a clock distributor 12, multiple variable delay lines 13*a*~13*h*, multiple buffers 14*a*~14*g*, a buffer 15, a multiplexer 16, and a clock driver configuration logic 17. The clock generator 11 generates clock and outputs the clock to the clock distributor 12. The clock distributor 12 distributes the clock supplied from the clock generator 11 and outputs the distributed clocks to the multiple variable delay lines 13a~13h.

The variable delay lines 13a~13h transmit the clocks supplied from the clock distributor upon certain delay. The delay lines are varied in accordance with selection signals (cfgVdl) from the clock driver configuration logic 17. The buffers 14a~14g output clocks supplied through the variable delay lines 13a~13g to the other boards in accordance with the control signal (sysen#) transmitted from the clock driver configuration logic 17.

Further, the buffer 15 buffers the clock supplied from the variable delay line 13h and outputs it to the multiplexer 16. The multiplexer 16 selects one of the clock supplied from the buffer 15 and the clock CLK0 supplied from another external board and outputs the selected clock as the clock CLK to be used in the relevant board itself.

The clock driver configuration logic 17 controls operations of the clock driver by determining whether the relevant board has been mounted on the system slot based upon the address signal (GA) and the slot enumeration signal (Enum#) supplied from higher-rank slots, if any. If a board mounted on a higher-rank slot exists, then the relevant board recognizes that it has not been mounted on the system slot. Accordingly, it blocks output of clocks CLK0~CLK6 to the other slots by controlling the buffers 14a~14g and at the same time, by controlling the multiplexer 16, selects the clock supplied from the external system slot and outputs such clock as the clock CLK to be used in the relevant board.

Alternatively, if a board on any higher-rank slot does not exist, the relevant board recognizes that it has been mounted on the system slot. Thus, the relevant board outputs clocks CLK0~CLK6 to the other slots by controlling the buffers 14a~14g and at the same time, by controlling the multiplexer 16, selects the clock supplied from the variable delay line 13h and outputs such clock as the clock CLK to be used in the relevant board.

If the board to which the clock driver configuration belongs has been mounted on the system slot, the clock driver configuration logic (17) outputs selection signals (cfgVdl) to the variable delay lines (13a~13g) in order to configure variable delay lines that are appropriate for the board mounted on the system slot. If slot 1 (SL1) is the system slot, the variable delay lines of the board on SL1 have one-tap delay (1d). If slot 2 (SL2) is the system slot, the variable delay lines of the board on SL2 have two-tap delay (2d). If slot 3 (SL3) is the system slot, the variable delay lines of the board on SL3 have three-tap delay (3d). If slot 4 (SL4) is the system slot, the variable delay lines of the board on SL4 have four-tap delay (4d). If slot 5 (SL5) is the system slot, the variable delay lines of the board on SL5 have five-tap delay (5d). If slot 6 (SL6) is the system slot, the variable delay lines of the board on SL6 have six-tap delay (6d). If slot 7 (SL7) is the system slot, the variable delay lines of the board on SL7 have seven-tap delay (7d). If slot 8 is the system slot, the variable delay lines of the board on SL8 have eight-tap delay (8d).

The variable delay line (13h) transmitting the clock to be used within the system board is always maintained to have eight-tap delay (8d) regardless of the location of the system slot on which the board is mounted, in order to make the phase of such clock have the same phase with the other clock routed to the other slots.

Figure 5:
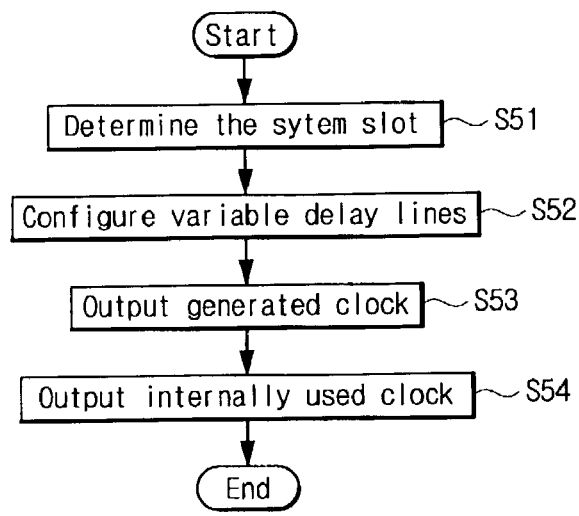
FIG. 5 illustrates a flow chart illustrating the operation of the clock driver installed on the system slot.
Figure 6:
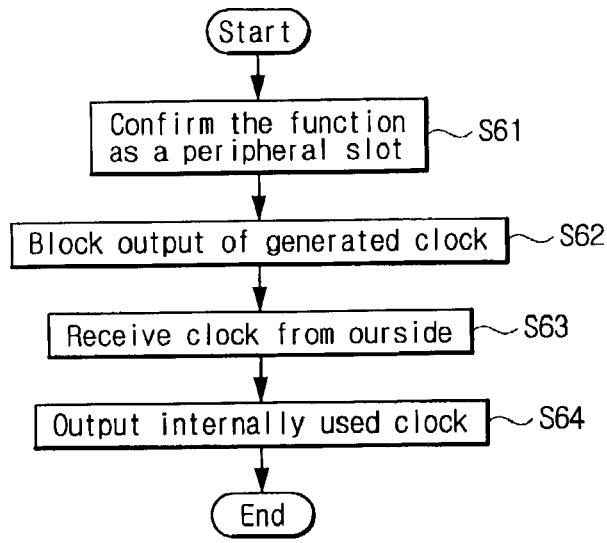
FIG. 6 illustrates a flow chart illustrating the operating of the clock driver installed on a peripheral slot.

Additional detail regarding the clock distribution on the above-described compact PCI based multi-processing system will be explained with reference to FIGS. 5 and 6. If no board is mounted on slot 1 (SL1) and system boards are mounted on slots 2, 3, and 4 (SL2, SL3, and SL4), and if an I/O board is mounted on slot 8 (SL8), the clock distribution operation will be as follows.

In the first step, the system slot must be determined. Preferably, the clock driver configuration logic (17) of the system board mounted on slot 2 (SL2) makes such determination. Specifically, the clock driver configuration logic (17) of the board mounted on slot 2 (SL2) checks only the enumeration signal (Enum#) of slot 1 (SL1) because its own address (GA) is "2." Upon checking Enum# of SL1, because no board is mounted on slot 1 (SL1), the clock driver configuration logic (17) of the board on slot 2 (SL2) recognizes that the slot on which the board itself is mounted, slot 2 (SL2), should function as the system slot (Step S51).

Next, when the clock driver configuration logic (17) of the board mounted on slot 2 (SL2) recognizes that its board has been mounted on the system board, the clock driver configuration logic (17) configures the delay lines so that they may have the delay of "2d" which is the appropriate delay amount for slot 2 (SL2), by outputting the relevant selection signals (cfgVdl) to the variable delay lines (13a~13g). Also, the clock driver configuration logic (17), by outputting the relevant selection signal (cfgVdl) to the variable delay line (13h), makes the delay line (13h) have the delay of "8d" (Step S52).

Also, the clock driver configuration logic (17) preferably controls the buffers (14a~14g) by outputting the control signal (sysen#) at the low level. Thus, the clocks (CLK0~CLK6) supplied through the variable delay lines (13a~adg) are outputted for the supply of the clocks (CLK0~CLK6) to the other slots (Step S53). Then, the clock supplied through the variable delay line (13h) is selected by the multiplexer (16) and is outputted as the clock (CLK) to be used internally in the board mounted on slot 2 (SL2) (Step S54).

Additionally, the clock driver configuration logics (17) of the system boards mounted on slots 3 and 4 (SL3 and SL4) preferably check the enumeration signal (Enum#) of slot 2 (SL2) and confirm that the system board is mounted on slot 2 (SL2). For example, it is recognized that the slots 3 and 4 (SL3 and SL4) on which their system boards are mounted will function as peripheral slots (Step S61). Thus, the clock driver configuration logics (17) of the system boards mounted on slots 3 and 4 (SL3 and SL4) output their respective control signals (sysen#) at the high level and thus control their respective buffers (14a~14g). In this manner, the clocks (CLK0~CLK6) supplied through the variable delay lines (13a~adg) are blocked and thus the clocks (CLK0~CLK6) are not outputted to the other slots from the respective system board on slot 3 (SL3) or slot 4 (SL4) (Step S62). Then, the clock (CLK0) supplied from the system slot, slot 2 (SL2), is selected by the multiplexer (16) and is outputted as the clock (CLK) to be used internally in the respective system board (Step S63 and Step S64).

Because the I/O board on slot 8 (SL8) is not a system board and thus slot 8 should function as a peripheral slot, the I/O board on slot 8 (SL8) receives the clock (CLK6) of the system slot, slot 2 (SL2), as the I/O board's clock (CLK0) and selects it (CLK0) as the clock to be used internally within the I/O board.

Additional detail of the delay on the delay lines for the clock transmission from the clock driver to each slot according to the preferred embodiment is next explained. For the clock transmission from slot 2 (SL2) to slot 3 (SL3): (i) the delay of "2d" occurs by the variable delay lines (13a~13g)

of the board mounted on slot 2 (SL2); (ii) the delay of "1*d*" occurs by the physical lines connecting slot 2 (SL2) and slot 3 (SL3); and (iii) the delay of "5*d*" additionally included on the back-plane for the clock (CLK1) of slot 2 (SL2) occurs. Thus, the total of "8*d*" delay occurs for the clock transmission from slot 2 (SL2) to slot 3 (SL3).

For the clock transmission from slot 2 (SL2) to slot 4 (SL4): (i) the delay of "2*d*" occurs by the variable delay lines (13*a*~13*g*) of the board mounted on slot 2 (SL2); (ii) the delay of "2*d*" occurs by the physical lines from slot 2 (SL2) to slot 4 (SL); and (iii) the delay of "4*d*" additionally included on the back plane for the clock (CLK2) of slot 2 (SL2) occurs. Thus, the total of "8*d*" delay occurs for the clock transmission from slot 2 (SL2) to slot 4 (SL).

Also, for the clock transmission from slot 2 (SL2) to slot 8 (SL8): (i) the delay of "2*d*" occurs by the variable delay lines (13*a*~13*g*) of the board mounted on slot 2 (SL2); (ii) the delay of "6*d*" occurs by the physical lines from slot 2 (SL2) to slot 8 (SL8); and (iii) the delay of "0d" occurs for the clock (CLK6) of slot 2 (SL2) on the back plane. Thus, the total of "8*d*" delay occurs for the clock transmission from slot 2 (SL2) to slot 8 (SL8).

Consequently, the clocks supplied from the system slot are delayed by the same length in arriving at their relevant destinations. Thus, the skew of the clocks may be minimized and the multi-processing system based upon the compact PCI may operate properly.

As described above, the present invention has many advantages. For example, the compact PCI based multi-processing system which processes signals upon mounting various circuit boards on multiple slots, even if the location of the system slot is varied, the skew of clocks transmitted to the other slots may be minimized. Accordingly, the system may be configured in a flexible manner because of such variability of the system slot's location. Further, the system may be efficiently repaired and maintained because it is possible to easily and quickly take measures in response to any failure occurring on the board mounted on the system slot.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A clock distribution device in a compact peripheral component interconnect (PCI) based multi-processing system comprising:
    a clock transmission device configured to transmit at least one clock between a first and second slot; and
    a clock driver configured to check whether the first slot is a system slot, the clock driver to generate a plurality of generated clocks, the clock driver to supply one of the generated clocks to the second slot, and to utilize one of the generated clocks for internal use if the first slot is the system slot, and the clock driver to block the generated clocks and to output a clock supplied from a system slot as a clock to be used internally if the first slot is not a system slots, wherein the clock driver comprises:
    a clock generator configured to generate a first clock signal,
    a clock distributor configured to distribute the first clock signal supplied from the clock generator into a plurality of second clock signals and output the plurality of second clock signals,
    a plurality of variable delay lines configured to delay and transmit the plurality of second clock signals though the plurality of variable delay lines of which a delay length may vary,
    a first buffer configured to switch at least one output of the plurality of second clocks to the second slot,
    a second buffer configured to store and output one of the plurality of second clock signals as a delay line for internal use,
    a multiplexer configured to select one of the plurality of second clock signals supplied from the second buffer and at least one clock supplied from an external system slot and the multiplexer to output the selected clock to be used internally within a multiplexer board, and
    a clock driver configuration logic configured to determine whether a clock driver board is mounted on a system board based upon an address signal and a slot enumeration signal of a higher-rank slot and the clock driver configuration logic to control operations of the variable delay lines, the first and second buffer, and the multiplexer.

2. The clock distribution device of claim 1, wherein the clock transmission device is implemented on a back-plane.

3. The clock distribution device of claim 2, wherein the clock transmission device is further configured to transmit a clock output from the first slot located at a higher rank to the second slot located at a lower rank.

4. The clock distribution device of claim 3, wherein, if a board is mounted on a higher-rank slot, the clock driver recognizes that a clock driver board is not mounted on the system slot, the clock driver blocks the plurality of generated clocks by controlling a first buffer, and the clock driver selects a clock supplied from an external system slot by controlling a multiplexer and the clock driver outputs the selected clock as an internal clock to be used internally within the clock driver board.

5. The clock distribution device of claim 1, wherein the clock driver to block the plurality of generated clocks and to output the clock supplied from the system slot as the clock to be used internally if the first slot is a peripheral slot.

6. The clock distribution device of claim 4, wherein a routing length on the back-plane of the clocks supplied from the system slot to the first and second slot by the clock driver are fixed in correspondence to a delay occurring at a time of a clock transmission.

7. The clock distribution device of claim 5, wherein the clock transmission device is further configured to transmit a clock output from the first slot located at a higher rank to the second slot located at a lower rank.

8. The clock distribution device of claim 1, wherein, if no board is mounted on a higher-rank slot, the clock driver configuration logic recognizes that a clock driver board is mounted on the system slot, the clock driver configuration logic outputs clocks by controlling the first buffer, and the clock driver configuration logic selects the clock supplied from the variable delay line specified for the clock to be used internally by controlling the multiplexer and outputs the selected clock as an internal clock to be used internally within the clock driver board.

9. The clock distribution device of claim 8, wherein if it is determined that the board to which the clock driver configuration logic belongs is mounted on the system slot, the clock driver configuration logic configures the variable delay lines corresponding to a location of the system slot by outputting relevant selection signals to the variable delay lines.

10. A clock distribution method in a compact Peripheral Component Interconnect (PCI) based multi-processing system, comprising:
configuring, at a board mounted on a system slot, a first delay line corresponding to a location of the system slot;
transmitting a clock signal generated at the board mounted on the system slot to a peripheral slot through the first delay line;
receiving, at a board mounted on the peripheral slot, clock signals transmitted from the system slot; and
selecting and using, at the board mounted on the peripheral slot, the clock signal received from the system slot as a system slot internal clock.

11. The method of claim 10, wherein a system board is not mounted on a higher-rank slot of the system slot.

12. The method of claim 10, wherein the board mounted on the system slot transmits the clock signal generated at the board mounted on the system slot to the peripheral slot through the internal clock delay lines, wherein an internal clock delay is equal to a total delay occurring through a plurality of lines.

13. The method of claim 10, wherein a plurality of clocks supplied from the system slot reach the peripheral slots at a same delay time.

14. A method of clock distribution in a compact Peripheral Component Interconnect (PCI) based multi-processing system, comprising:
generating a first clock signal;
distributing the first clock signal into a plurality of second clock signals;
outputting each of the plurality of second clock signals through a corresponding variable delay line of a plurality of variable delay lines;
switching an output of at least one of the plurality of second clock signals to a first and second slot using a first buffer;
buffering and outputting the output of one of the plurality of second clock signals, using a second buffer, and specifying one of the plurality of second clock signals as an internal use clock.

15. The method of claim 14, further comprising selecting one of the plurality of second clock signals from at least one of the second buffer and an external slot to be used internally within a board.

16. A clock driver for a compact Peripheral Component Interconnect (PCI), comprising:
a clock generator configured to generate a first clock signal;
a clock distributor configured to distribute the first clock signal supplied from the clock generator into a plurality of second clock signals and output the plurality of second clock signals;
a plurality of variable delay lines configured to delay and transmit the plurality of second clock signals through the plurality of variable delay lines of which the delay length may vary;
a first buffer configured to switch at least one of the plurality of second clocks to a first and second slot;
a second buffer configured to store and output one of the plurality of second clock signals as a delay line for internal use of the first clock signal;
a multiplexer configured to select one of the plurality of second clock signals supplied from the second buffer and at least one of the plurality of the second clocks supplied from an external system slot and the multiplexer to output a selected clock to be used internally within a board having the multiplexer; and
a clock driver configuration logic configured to determine whether a clock driver board is mounted on a system board based upon an address signal and a slot enumeration signal of a higher-rank slot and the clock driver configuration logic to control operations of the variable delay lines, the first and second buffer, and the multiplexer, wherein the clock driver is configured to check whether a first slot is a system slot, the clock driver further to supply a second slot generated clock to the second slot if the first slot is the system slot, and the clock driver to provide the second slot generated clock for the second clock's internal use if the first slot is not the system slot.

* * * * *